United States Patent
Rossi et al.

(10) Patent No.: US 8,749,099 B2
(45) Date of Patent: *Jun. 10, 2014

(54) CLAMPING CIRCUIT TO A REFERENCE VOLTAGE FOR ULTRASOUND APPLICATIONS

(75) Inventors: Sandro Rossi, Pavia (IT); Davide Ugo Ghisu, Milan (IT); Antonio Ricciardo, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 24 days.

This patent is subject to a terminal disclaimer.

(21) Appl. No.: 13/538,840

(22) Filed: Jun. 29, 2012

(65) Prior Publication Data

US 2012/0268092 A1    Oct. 25, 2012

Related U.S. Application Data

(63) Continuation-in-part of application No. PCT/EP2010/005931, filed on Sep. 29, 2010, and a continuation-in-part of application No. PCT/EP2010/005932, filed on Sep. 29, 2010, and a continuation-in-part of application No. PCT/EP2010/005927, filed on Sep. 29, 2010, and a continuation-in-part of application No. PCT/EP2010/005930, filed on Sep. 29, 2010.

(30) Foreign Application Priority Data

Dec. 30, 2009 (IT) ............................. MI2009A2338
Dec. 30, 2009 (IT) ............................. MI2009A2339
Dec. 30, 2009 (IT) ............................. MI2009A2340
Dec. 30, 2009 (IT) ............................. MI2009A2341

(51) Int. Cl.
*H03K 3/00* (2006.01)

(52) U.S. Cl.
USPC ........................................ 307/108

(58) Field of Classification Search
USPC ........... 323/265, 273, 282, 351; 327/108–112
See application file for complete search history.

(56) References Cited

U.S. PATENT DOCUMENTS

| | | | | |
|---|---|---|---|---|
| 3,958,127 A * | 5/1976 | Faulhaber et al. | ....... | 250/559.49 |
| 5,414,378 A | 5/1995 | Edgar et al. | | |
| 5,475,342 A | 12/1995 | Nakamura et al. | | |
| 6,050,945 A | 4/2000 | Peterson et al. | | |
| 6,269,052 B1 | 7/2001 | Oppelt | | |
| 6,540,677 B1 | 4/2003 | Angelsen et al. | | |
| 7,324,167 B2 * | 1/2008 | Miller | .......................... | 348/723 |
| 7,432,737 B2 | 10/2008 | Yoshida | | |

(Continued)

FOREIGN PATENT DOCUMENTS

WO     2005/078931 A1    8/2005

*Primary Examiner* — Adolf Berhane
(74) *Attorney, Agent, or Firm* — Seed IP Law Group PLLC (57) ABSTRACT

A clamping circuit includes a clamping core connected to an output terminal and having a central node connected to a voltage reference and at least one first and one second clamp transistor, connected to the central node and having respective control terminals, the clamping core being also connected at the input to a low voltage input driver block. The clamping core includes a first switching off transistor connected to the output terminal and to the first clamp transistor, as well as a second switching off transistor connected to the output terminal and to the second clamp transistor.

25 Claims, 4 Drawing Sheets (56) References Cited

U.S. PATENT DOCUMENTS

| | | |
|---|---|---|
| 7,760,272 B2 * | 7/2010 | Miller .......................... 348/723 |
| 7,888,985 B2 | 2/2011 | Osaka |
| 8,159,267 B2 | 4/2012 | Yoshida |
| 2002/0070805 A1 | 6/2002 | Ausserlechner et al. |
| 2004/0227556 A1 | 11/2004 | Ohmori |
| 2005/0139931 A1 | 6/2005 | Arai |
| 2008/0116751 A1 | 5/2008 | Kihara et al. |
| 2009/0206676 A1 | 8/2009 | Chu et al. |
| 2010/0067915 A1 * | 3/2010 | Fukasaku et al. ............ 398/116 |
| 2011/0115540 A1 | 5/2011 | Kamp |
| 2012/0268092 A1 | 10/2012 | Rossi et al. |
| 2012/0268186 A1 * | 10/2012 | Rossi et al. ................... 327/309 |
| 2012/0268189 A1 * | 10/2012 | Rossi et al. ................... 327/333 |
| 2012/0268200 A1 * | 10/2012 | Rossi et al. ................... 327/574 |

* cited by examiner

CLAMPING CIRCUIT TO A REFERENCE VOLTAGE FOR ULTRASOUND APPLICATIONS

BACKGROUND

1. Technical Field

The present disclosure relates to a clamping circuit to a voltage reference, for example to ground.

2. Description of the Related Art

Sonography or ultrasonography is a system of medical diagnostic testing that uses ultrasonic waves or ultrasounds and is based on the principle of the transmission of the ultrasounds and of the emission of echo and is widely used in the internistic, surgical and radiological field.

The ultrasounds being normally used are comprised between 2 and 20 MHz. The frequency is chosen by taking into consideration that higher frequencies have a greater image resolving power, but penetrate less in depth in the subject under examination.

These ultrasounds are normally generated by a piezoceramic crystal inserted in a probe being maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which is suitably processed by a computer and displayed on a monitor.

The ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with the sonography it is generally not possible to see behind a bone, which causes a total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Generally, an ultrasonographer, in particular a diagnostic apparatus based on the ultrasound sonography, comprises three parts:

- a probe comprising at least one transducer, for example of the ultrasonic type, which transmits and receives an ultrasound signal;
- an electronic system that drives the transducer for the generation of the ultrasound signal or pulse to be transmitted and receives an echo signal of return at the probe of this pulse, processing in consequence the received echo signal; and
- a displaying system of a corresponding sonography image processed starting from the echo signal received by the probe.

The word transducer generally indicates an electric or electronic device that converts a type of energy relative to mechanical and physical quantities into electric signals. In a broad sense, a transducer is sometimes defined as any device that converts energy from one form to another, so that this latter can be re-processed, for example by men or by other machines. Many transducers are both sensors and actuators. An ultrasonic transducer usually comprises a piezoelectric crystal that is suitably biased for causing its deformation and the generation of the ultrasound signal or pulse.

Figure 1:
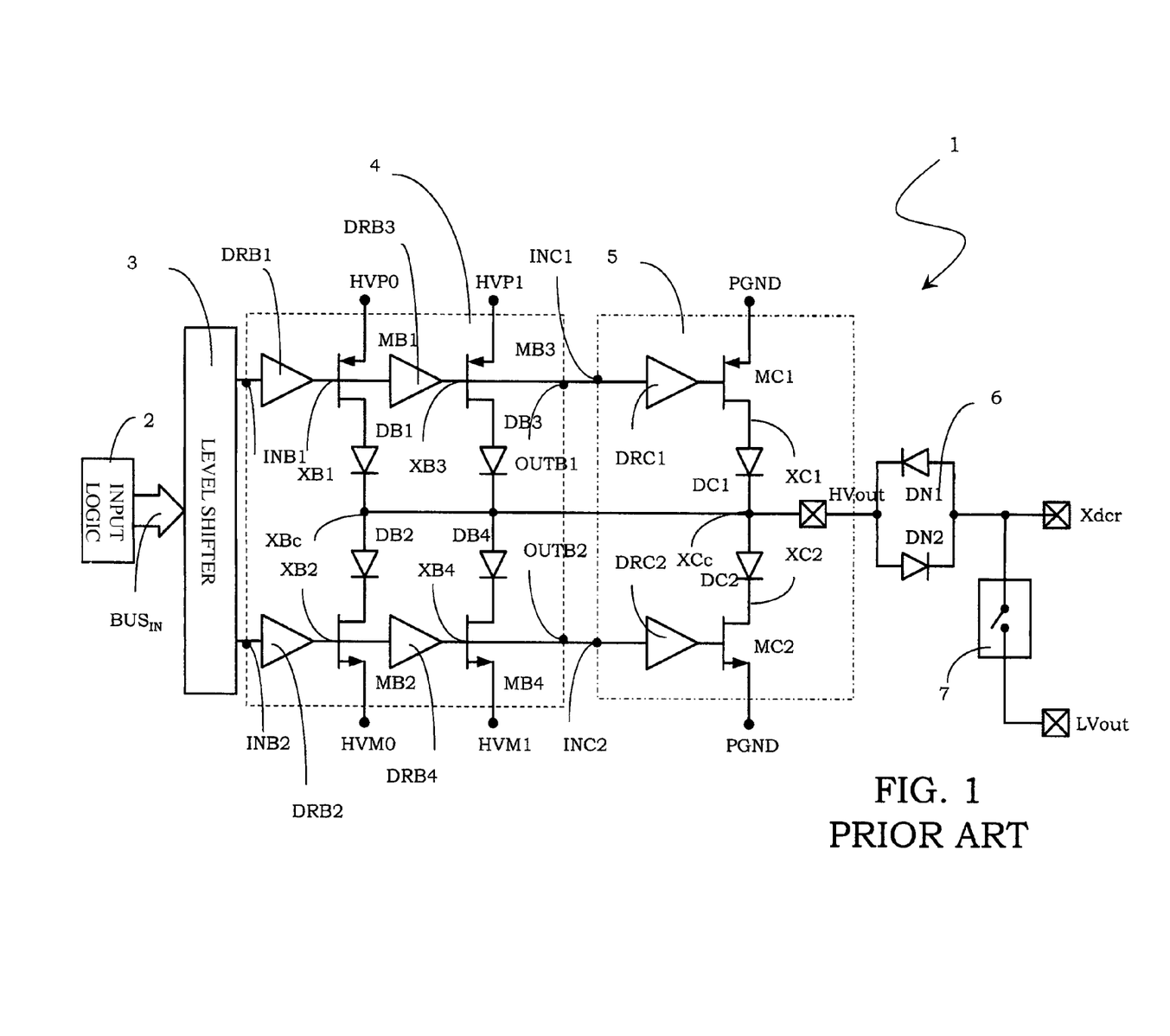
FIG. 1 schematically shows a transmission channel for ultrasound applications realized according to the prior art.

A typical transmission channel or TX channel being used in these applications is schematically shown in FIG. 1.

The transmission channel 1 comprises an input logic 2 that drives, in correspondence with an input bus $BUS_{IN}$, a level shifter 3, in turn connected to a high voltage buffer block 4. The high voltage buffer block 4 is electrically coupled between pairs of high voltage reference terminals, respectively higher HVP0 and HVP1 and lower HVM0 and HVM1, and has a pair of input terminals, INB1 and INB2, connected to the level shifter 3, as well as a pair of output terminals, OUTB1 and OUTB2, connected to a corresponding pair of input terminals, INC1 and INC2 of a clamping block 5.

Furthermore, the clamping block 5 is connected to a clamp voltage reference terminal PGND and has an output terminal corresponding to a first output terminal HVout of the transmission channel 1, in turn connected, through an anti-noise block 6, to a connection terminal Xdcr for the transducer to be driven through the transmission channel 1.

A high voltage switch 7 is electrically coupled between the connection terminal Xdcr and a second output terminal LVout of the transmission channel 1. This high voltage switch 7 is able to transmit an output signal being at the output of the anti-noise block 6 to the output terminal LVout during the receiving step of the transmission channel 1.

It is to be noted that the switch 7 may be a high voltage one since, during the transmission step of the transmission channel 1, a signal being on the connection terminal Xdcr, always indicated with Xdcr, is a high voltage signal although the switch 7 is off. When this switch 7 is instead on, i.e., during the reception step of the transmission channel 1, the signal Xdcr is generally at a voltage value next to zero since the piezoelectric transducer connected to the transmission channel 1 is sensing small return echoes of ultrasound pulse signals, as shown in FIG. 2.

Typically an ultrasonic transducer transmits a high voltage pulse of the duration of a few us, and listens for reception of an echo of this pulse, generated by the reflection on the organs of a subject under examination, for the duration of about 250 us, to go back to the transmission of a new high voltage pulse.

Figure 2:
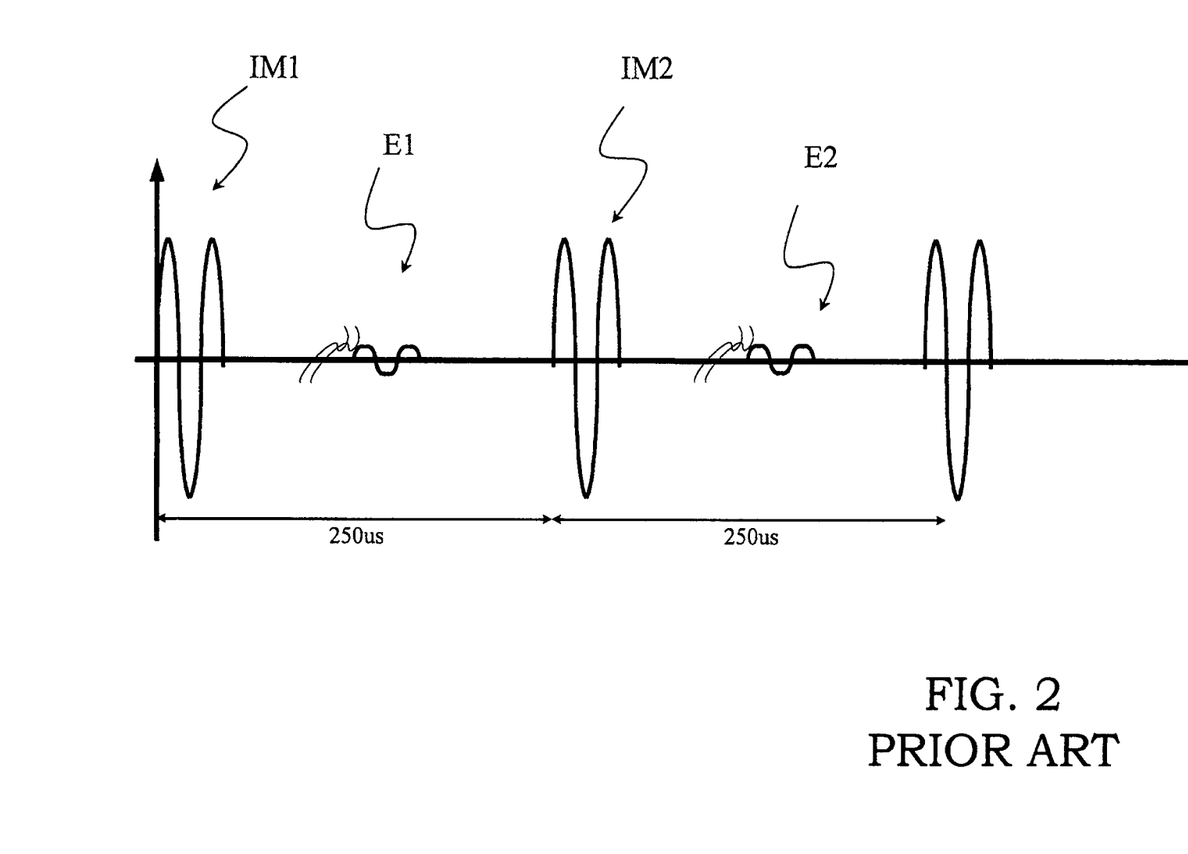
FIG. 2 schematically shows a first and a second ultrasound pulse being used in an ultrasonic transducer.

For example, a first pulse IM1 and a second pulse IM2 are transmitted with a peak to peak excursion equal, in the example shown, to 190 Vpp with reception by the transducer of corresponding echoes shown in FIG. 2 and indicated with E1 and E2.

In general, then, the switch 7 is a high voltage one so as not to break itself during the transmission step but it is in practice on always with low voltages during the reception step.

More in detail, the high voltage buffer block 4 comprises a first branch comprising a first buffer transistor MB1 and a first buffer diode DB1, being electrically coupled, in series to each other, between a first higher voltage reference terminal HVP0 and a buffer central node XBc, as well as a second buffer diode DB2 and a second buffer transistor MB2, being electrically coupled, in series to each other, between the buffer central node XBc and a first lower voltage reference terminal HVM0. The first and second buffer transistors, MB1 and MB2, have respective control or gate terminals in correspondence with a first XB1 and a second inner circuit node XB2 of the high voltage buffer block 4 and connected to, and driven by, a first DRB1 and a second buffer input driver DRB2, in turn connected to the level shifter 3 in correspondence with the first and second input terminals, INB1 and INB2, of the high voltage buffer block 4.

The high voltage buffer block 4 also comprises, in parallel to the first branch, a second branch in turn comprising a third buffer transistor MB3 and a third buffer diode DB3, electrically coupled, in series to each other, between a second higher voltage reference terminal HVP1 and the buffer central node XBc, as well as a fourth buffer diode DB4 and a fourth buffer transistor MB4, electrically coupled, in series to each other, between the buffer central node XBc and a second lower voltage reference terminal HVM1. The third and fourth buffer transistors, MB3 and MB4, have respective control or gate terminals in correspondence with a third XB3 and a fourth inner circuit node XB4 of the high voltage buffer block 4 and connected to, and driven by, a third DRB3 and a fourth buffer input driver DRB4, in turn connected to the first XB1 and to the second inner circuit node XB2 and then to the first DRB1 and to the second buffer input driver DRB2, respectively, as well as to a first OUTB1 and to a second output terminal OUTB2.

In the example of the figure, the first and third buffer transistors, MB1 and MB3, are high voltage P-channel MOS (Metal Oxide Semiconductor) transistors (HV Pmos) while the second and fourth buffer transistors, MB2 and MB4, are high voltage N-channel MOS transistors (HV Nmos). Moreover, the buffer diodes, DB1, DB2, DB3 and DB4, are high voltage diodes (HV diode).

The clamping block 5 has in turn a first INC1 and a second input terminal INC2, respectively connected to the first OUTB1 and second OUTB2 output terminals of the high voltage buffer block 4.

As illustrated, the clamping block 5 comprises a first clamp driver DRC1 connected between the first input terminal INC1 and a control or gate terminal of a first clamp transistor MC1, in turn electrically coupled, in series with a first clamp diode DC1, between the clamp voltage reference terminal PGND, for example, a ground, and a clamp central node XCc. The first clamp transistor MC1 and the first clamp diode DC1 are interconnected in correspondence with a first clamp circuit node XC1.

The clamping block 5 also comprises a second clamp driver DRC2 connected between the second input terminal INC2 and a control or gate terminal of a second clamp transistor MC2, in turn electrically coupled, in series with a second clamp diode DC2, between the clamp central node XCc and the clamp voltage reference terminal PGND. The second clamp transistor MC2 and the second clamp diode DC2 are interconnected in correspondence with a second clamp circuit node XC2.

The clamp circuit node XCc is also connected to the first output terminal HVout of the transmission channel 1, in turn connected to the connection terminal Xdcr through an anti-noise block 6 comprising respective first and second anti-noise diodes, DN1 and DN2, connected in antiparallel, by having the anode terminal of the first diode connected to the cathode terminal of the second one and vice versa, between these first output terminal HVout and connection terminal Xdcr.

In the example of the figure, the first clamp transistor MC1 is a high voltage P-channel MOS transistor (HV Pmos) while the second clamp transistor MC2 is a high voltage N-channel MOS transistor (HV Nmos). Moreover, the clamp diodes, DC1 and DC2, are high voltage diodes (HV diode) while the anti-noise diodes, DN1 and DN2, are low voltage diodes (LV diode).

Figure 3:
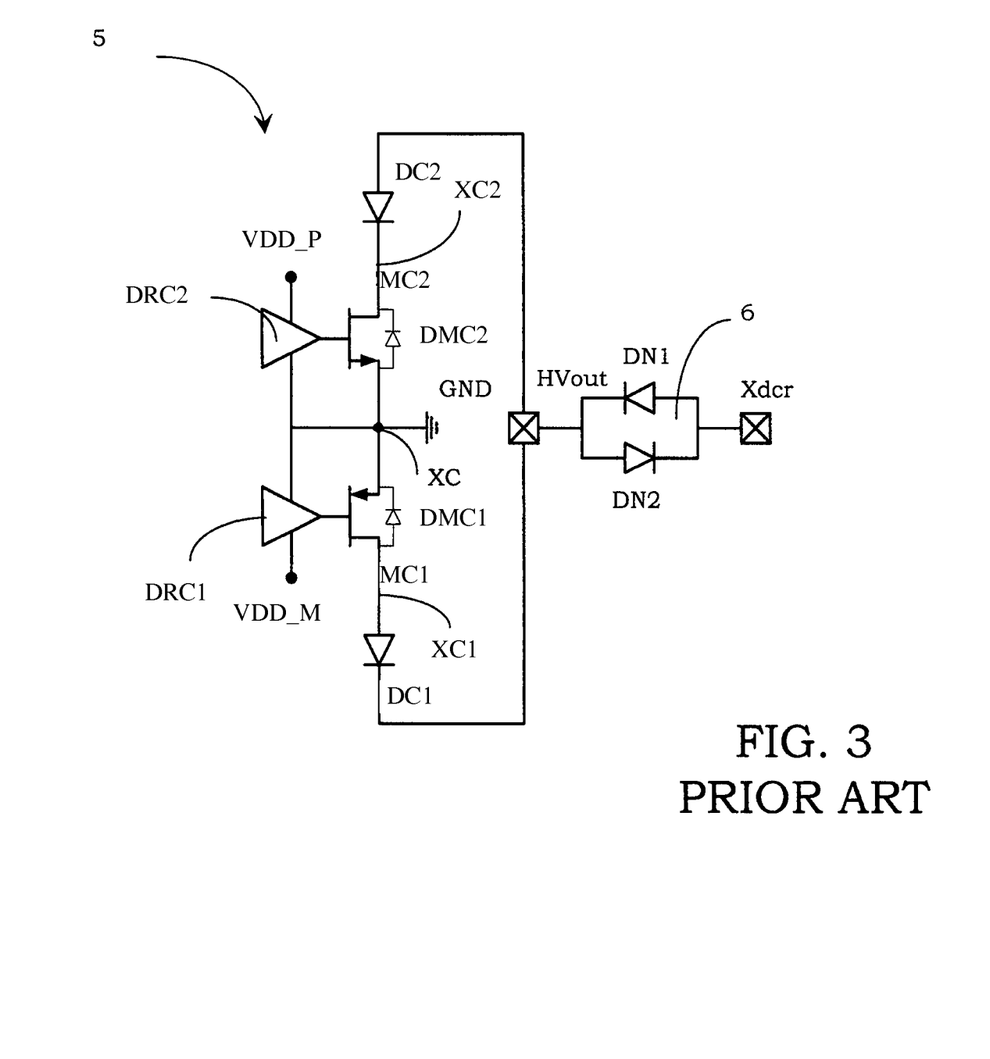
FIG. 3 shows in greater detail a block comprised within the transmission channel of FIG. 1.

The clamping block 5 is also shown in FIG. 3, in the case of a clamping operation to a ground voltage reference terminal GND, e.g., in the receiving step of the transmission channel 1. Moreover, the clamping to the ground voltage reference terminal GND may be ensured also when the load is mainly capacitive. In this case, the output terminal of the transmission channel is brought back to this ground value after the transmission. The clamping to the ground is used in applications in which the high voltage wave form to be transmitted, besides oscillating between a high voltage positive value and a high voltage negative value, stays for determined periods of time at the ground value. Also the anti-noise block 6 is indicated, connected between the first output terminal HVout and the connection terminal Xdcr of the transmission channel 1.

This FIG. 3 shows also the equivalent diodes, DMC1 and DMC2, of the clamp transistors, MC1 and MC2, respectively, the first and second clamp input drivers, DRC1 and DRC2, being connected between a first and a second clamp supply voltage reference terminal, higher VDD_P and lower VDD_M, respectively, and the ground GND, whereto also the clamp central node XC is connected.

BRIEF SUMMARY

In an embodiment, a clamping circuit to a voltage reference of the type comprising at least one clamping core connected to an output terminal and having a central node connected to the voltage reference and in turn including at least one first and one second clamp transistor, connected to the central node and having respective control terminals, the clamping core being also connected at the input to an input driver block.

In an embodiment, a transmission channel comprises at least such a clamping circuit.

An embodiment relates to a clamping circuit suitable for being used by a transmission channel for ultrasound applications and the following description is made with reference to this field of application by way of illustration only.

From the scheme of FIG. 3 it can be seen that when the clamping block 5 is on, the first output terminal HVout is at a voltage value, corresponding to the ground voltage value GND plus or minus a diode voltage and the connection terminal Xdcr at a ground voltage value GND plus or minus two diode voltages. The ideal working condition would have this first output terminal HVout at a value equal to the ground GND, condition in which the distortions of the transmitted signal from the transmission channel 1 are minimal. In fact, the real operation conditions of the above illustrated clamping block 5 show worsening in the performances of second harmonic, especially under low supply voltage conditions.

In the case of connection of a load of great value, a high current can circulate through the high voltage clamp diodes DC1 and DC2, charging the intrinsic junction capacities of the same diodes and resulting in a malfunction.

In fact, during the receiving step of the transmission channel 1, it should be awaited that the connection terminal Xdcr is at zero. Any leakage current of the first output terminal HVout, caused by the noise introduced by the charges being in the clamp diodes DC1 and DC2, causes a raising of the voltage value also on this connection terminal and then a receiving disturbance.

Once the high voltage buffer block 4 is turned on again, the first output terminal HVout does not immediately respond since most of the current supplied by this high voltage buffer block 4 is used for the discharge of the junction capacities of the clamp diodes DC1 and DC2, precharged during the clamping step. This malfunction is particularly felt in the case of short pulses.

Moreover, during the receiving step in which the clamping block 5 is on and the connection terminal Xdcr has a voltage value next to but not equal to the ground GND, a leakage current could charge the first output terminal HVout at a voltage higher than the threshold voltage of the anti-noise diodes, DN1 and DN2, of the anti-noise block 6 and, in consequence, disturb a reception on the connection terminal Xdcr indeed.

In an embodiment, a clamping circuit is configured to facilitate applying a clamping to a voltage reference, in particular ground, in correspondence with an output terminal thereof, suitable for being used by a transmission channel for ultrasound applications and having such structural and functional features as to facilitate overcoming the limits and the drawbacks still affecting the circuits realized according to the prior art.

An embodiment associates with the clamp transistors corresponding high voltage MOS transistors able to close themselves when the clamping circuit is active and likewise able to sustain high positive and negative voltages when instead the clamping circuit is not active and the transistors are in open configuration.

For example, the high voltage MOS transistors are driven by suitable switching off circuitry configured to control switching off of an output terminal of the clamping circuit and thus a clamp to a voltage reference, for example, a ground.

In an embodiment, a clamping circuit to a voltage reference is of the type comprising at least one clamp core connected to an output terminal and having a central node connected to said voltage reference and in turn including at least one first and one second clamp transistor, connected to said central node and having respective control terminals, said clamp core being also connected at the input to a low voltage input driver block, said clamping circuit being characterized in that said clamp core further comprises at least one first switching off transistor connected to said output terminal and to said first clamp transistor, as well as a second switching off transistor connected to said output terminal and to said second clamp transistor, said first and second clamp transistors being high voltage MOS transistors of complementary type and said first and second switching off transistor being high voltage MOS transistors of complementary type and connected to said first and second clamp transistors by having the respective equivalent or body diodes in anti-series so as to close themselves when said clamping circuit is active and to sustain high positive and negative voltages when said clamping circuit is not active.

Embodiments may comprise supplementary and optional characteristics, taken alone or in combination.

In an embodiment, said first switching off transistor may be a high voltage P-channel MOS transistor and said second switching off transistor may be a high voltage N-channel MOS transistor.

In an embodiment, said clamping circuit may further comprise a driving circuit connected to respective control terminals of said first and second clamp transistors and of said first and second switching off transistors and suitable for closing said first and second switching off transistors when said clamping circuit is active.

In an embodiment, said clamping circuit may comprise a first and a second driving transistor, electrically coupled, in a crossed way, between said control terminals of said first and second clamp transistor, and respective control terminals of said first and second switching off transistors.

In an embodiment, said first driving transistor may be electrically coupled between said control terminal of said first clamp transistor and a control terminal of said second switching off transistor and said second driving transistor may be electrically coupled between a control terminal of said first switching off transistor and said control terminal of said second clamp transistor.

In an embodiment, said first and second driving transistors may have respective control terminals connected to said central node.

In an embodiment, said input driver block may comprise a first and a second driver electrically coupled between a first and a second supply voltage reference and having respective output terminals connected to said control terminals of said first and second clamp transistors.

In an embodiment, said first clamp transistor may be a high voltage N-channel MOS transistor and said second clamp transistor may be a high voltage P-channel MOS transistor.

In an embodiment, said first and second driving transistors may be high voltage MOS transistors of the type similar with respect to said first and second switching off transistors.

In an embodiment, said first driving transistor may be a high voltage N-channel MOS transistor and said second driving transistor may be a high voltage P-channel MOS transistor.

In an embodiment, a transmission channel is of the type comprising at least one clamping circuit as above described, electrically coupled between an input driver block and an anti-noise circuit, said anti-noise circuit being connected between said output terminal of said clamping circuit and a connection terminal of said transmission channel and said input driver block being connected to a high voltage buffer block of said transmission channel.

In an embodiment, a high-voltage clamping device comprises: an output; an input configured to couple to a reference voltage; a first clamping transistor; a second clamping transistor; a first switching transistor coupled between the output and the first clamping transistor; and a second switching transistor coupled between the output and the second clamping transistor, wherein, the first and second clamping transistors are high-voltage MOS transistors of complementary types; the first clamping transistor is coupled between the first switching transistor and the input, the first clamping transistor and the first switching transistor having body diodes coupled together in anti-series; and the second clamping transistor is coupled between the second switching transistor and the input, the second clamping transistor and the second switching transistor having body diodes coupled together in anti-series. In an embodiment, said first switching transistor is a high voltage P-channel MOS transistor and said second switching transistor is a high voltage N-channel MOS transistor. In an embodiment, the device further comprises a driving circuit coupled to respective control terminals of said first and second clamp transistors and of said first and second switching transistors and configured to generate driving signals to close said first and second switching transistors when said clamping circuit is active. In an embodiment, said driving circuit comprises: a first driving transistor coupled between the control terminal of the first clamping transistor and the control terminal of the second switching transistor; and a second driving transistor coupled between the control terminal of the second clamping transistor and the control terminal of the first switching transistor. In an embodiment, said first and second driving transistors have respective control terminals connected to said input. In an embodiment, the control terminal of the first clamping transistor is configured to couple to an output of a first driver of an input driver block and the control terminal of the second clamping transistor is configured to couple to an output of a second driver of the input driver block. In an embodiment, the device comprises the input driver block and the first driver is configured to couple between first and second supply voltage references and the second driver is configured to couple between the first and second supply voltages. In an embodiment, said first clamping transistor is a high voltage N-channel MOS transistor and said second clamping transistor is a high voltage P-channel MOS transistor. In an embodiment, said first driving transistor and the first switching transistor are of a first MOS type and the second driving transistor and the second switching transistor are of a second MOS type complementary to the first MOS type. In an embodiment, said first switching transistor is a high voltage N-channel MOS transistor and said second switching transistor is a high voltage P-channel MOS transistor.

In an embodiment, a system comprises: a voltage clamping core, including: an output; an input configured to couple to a reference voltage; a first clamping transistor; a second clamping transistor; a first switching transistor coupled between the output and the first clamping transistor; and a second switching transistor coupled between the output and the second clamping transistor, wherein, the first and second clamping transistors are high-voltage MOS transistors of complementary types; the first clamping transistor is coupled between the first switching transistor and the input, the first clamping transistor and the first switching transistor having body diodes coupled together in anti-series; and the second clamping transistor is coupled between the second switching transistor and the input, the second clamping transistor and the second switching transistor having body diodes coupled together in anti-series; and a switching transistor driving block configured to generate driving signals to close said first and second switching transistors when said clamping core is active. In an embodiment, said switching transistor driving block comprises: a first driving transistor coupled between the control terminal of the first clamping transistor and the control terminal of the second switching transistor; and a second driving transistor coupled between the control terminal of the second clamping transistor and the control terminal of the first switching transistor. In an embodiment, said first and second driving transistors have respective control terminals connected to said input. In an embodiment, the control terminal of the first clamping transistor is configured to couple to an output of a first driver of an input driver block and the control terminal of the second clamping transistor is configured to couple to an output of a second driver of the input driver block. In an embodiment, the system further comprises the input driver block and the first driver is configured to couple between first and second supply voltage references and the second driver is configured to couple between the first and second supply voltages. In an embodiment, the system further comprises an anti-noise block coupled between the output of the clamping core and a transmission channel output; a high-voltage buffer block of the transmission channel; and an input driver block coupled between the high-voltage buffer block and the voltage clamping core. In an embodiment, the reference voltage is a ground.

In an embodiment, a transmission channel comprises: means for clamping an output of the transmission channel to a reference voltage; anti-charging means coupled to the means for clamping. In an embodiment, the means for clamping comprises first and second MOS clamping transistors and the anti-charging means includes a first MOS switching transistor coupled to the first MOS clamping transistor with body diodes coupled together in anti-series and a second MOS switching transistor coupled to the second MOS clamping transistor with body diodes coupled together in anti-series. In an embodiment, the anti-charging means comprises means for closing said first and second switching transistors when said means for clamping is activated. In an embodiment, the transmission channel further comprises means for driving the means for clamping. In an embodiment, the transmission channel further comprises means for buffering coupled to the means for driving. In an embodiment, the transmission channel further comprises means for reducing noise coupled to the means for clamping.

In an embodiment, a method comprises: transmitting a series of high-voltage pulses through a transmission channel; and clamping an output of the transmission channel to a reference voltage between pulses, the clamping including, closing a first switching MOS transistor coupled between a first clamping transistor and the output, wherein the first clamping transistor is coupled between the reference voltage and the first switching transistor; and closing a second switching MOS transistor coupled between a second clamping transistor and the output, wherein the second clamping transistor is coupled between the reference voltage and the second switching MOS transistor. In an embodiment, the method comprises opening the first and second switching transistors during transmission of the pulses. In an embodiment, the method further comprises listening for echoes of the pulses.

Various characteristics and advantages of embodiments of clamping circuits as disclosed herein will be apparent from the following description of an embodiment thereof given by way of indicative and non limiting example with reference to the annexed drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, high-voltage transistors, diodes, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 4:
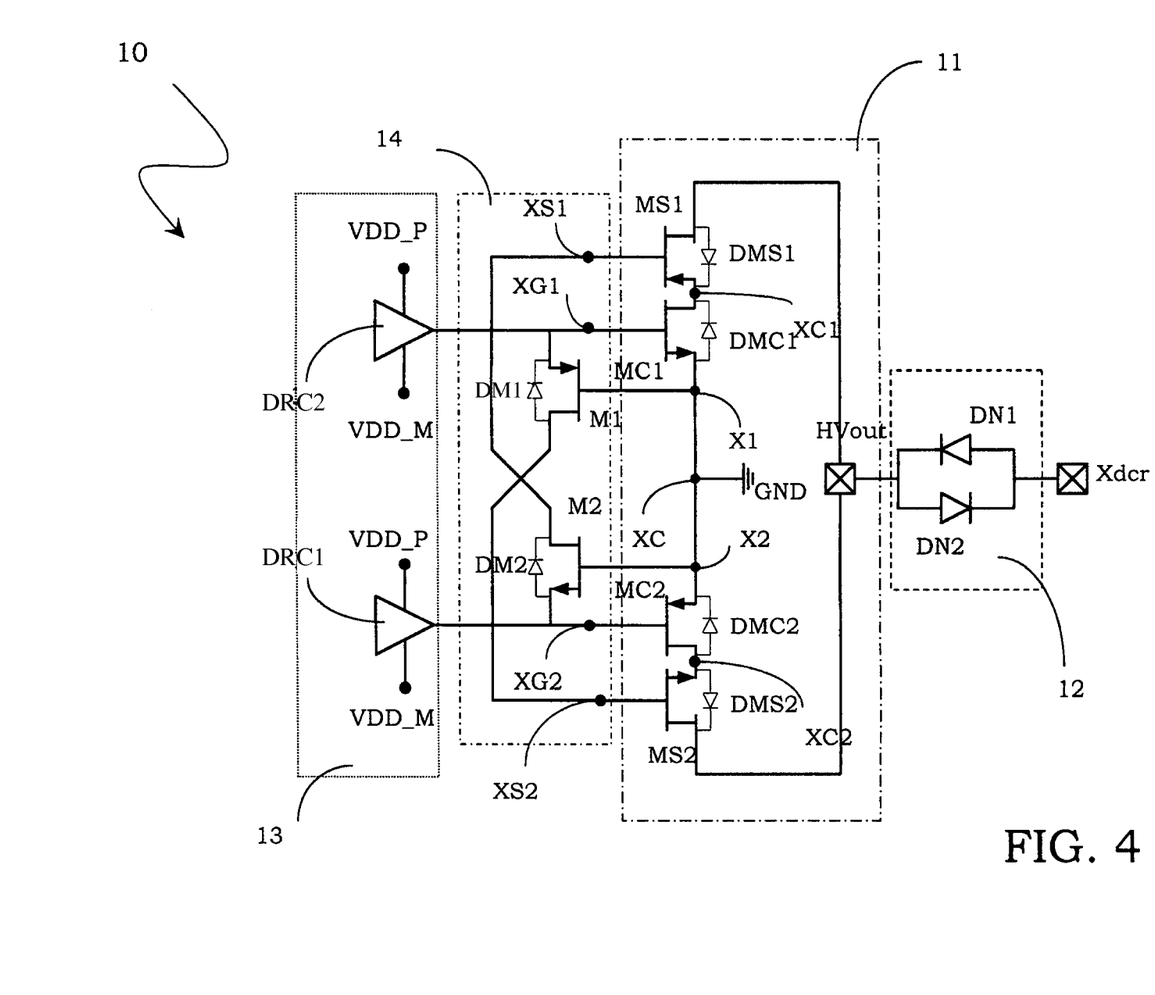
FIG. 4 schematically shows an embodiment of a clamping circuit, that may for example be used in a transmission channel for ultrasound applications.

With reference to these figures, and in particular to FIG. 4, a clamping circuit is described, that may for example be used in a transmission channel for ultrasound applications, globally indicated with 10.

The clamping circuit 10 comprises a clamping core 11 connected to an output terminal HVout and having a central node XC connected to a voltage reference terminal, as illustrated a ground GND.

The clamping core 11 comprises a first and a second clamp transistor, MC1 and MC2, connected to this central node XC and having respective control or gate terminals, XG1 and XG2.

These first and second clamp transistors, MC1 and MC2, have respective first and second equivalent diodes, DMC1 and DMC2, as indicated in the figure. In the example of the figure, the first clamp transistor MC1 is a high voltage N-channel MOS transistor (HV Nmos) while the second clamp transistor MC2 is a high voltage P-channel MOS transistor (HV Pmos).

According to an embodiment, the clamping core 11 also comprises a first and a second switching off transistor, MS1 and MS2. The first switching off transistor MS1 is electrically coupled in series to the first clamp transistor MC1 and connected to the output terminal HVout. Moreover, the second switching off transistor MS2 is electrically coupled in series to the second clamp transistor MC2 and also connected to the output terminal HVout.

These first and second switching off transistors, MS1 and MS2, have respective first and second equivalent diodes, DMS1 and DMS2, as indicated in the figure. In particular, the first and second switching off transistors, MS1 and MS2, are high voltage MOS transistors of opposed type with respect to the clamp transistors MC1 and MC2. In the example of the figure, the first switching off transistor MS1 is a high voltage P-channel MOS transistor (HV Pmos) while the second switching off transistor MS2 is a high voltage N-channel MOS transistor (HV Nmos). Moreover, the first equivalent or body diodes, DMS1 and DMC1, of the first switching off transistor MS1 and of the first clamping transistor MC1, respectively, are connected in anti-series in correspondence with a first clamp circuit node XC1. Analogously, the second equivalent or body diodes, DMS2 and DMC2, of the second switching off transistor MS2 and of the second clamping transistor MC2, respectively, are connected in anti-series in correspondence with a second clamp circuit node XC2.

According to an embodiment, these first and second switching off transistors, MS1 and MS2, are MOS transistors able to close themselves when the clamping circuit 10 is active and to sustain positive and negative high voltages when the clamping circuit is not active and the transistors are in open configuration, and are coupled to a suitable driving circuit, as discussed hereafter.

The clamping core 11 is connected, in correspondence with the output terminal HVout to an anti-noise circuit 12 comprising respective first and second anti-noise diodes, DN1 and DN2, connected in antiparallel, by having the anode terminal of the first diode connected to the cathode terminal of the second one and vice versa, between this first output terminal HVout and a connection terminal Xdcr.

Further, the clamping core 11 is also connected at the input to an input driver block 13 through a driving circuit 14 of the switching off transistors MS1 and MS2, suitable for closing the first and second switching off transistors, MS1 and MS2 when the clamping circuit 10 is active, as it will be clarified hereafter in the description.

The input driver block 13 may be of the low voltage type and comprises a first driver DRC1 electrically coupled between a first clamp supply voltage reference terminal and a second clamp supply voltage reference terminal, higher VDD_P and lower VDD_M, respectively, and having an output terminal connected to the first control terminal XG1 of the first clamp transistor MC1 as well as a second driver DRC2, in turn electrically coupled between the first and second clamp supply voltage reference terminals, higher VDD_P and lower VDD_M, and having an output terminal connected to the second control terminal XG2 of the second clamp transistor MC2.

According to an embodiment, the driving circuit 14 comprises a first and a second driving transistor, M1 and M2, electrically coupled, in a crossed way, between the control terminals of the first and second clamp transistors, MC1 and MC2, and of the first and second switching off transistors, MS1 and MS2.

As illustrated, the first driving transistor M1 is electrically coupled between the control terminal XG1 of the first clamp transistor MC1 and a control or gate terminal XS2 of the second switching off transistor MS2, while the second driving transistor M2 is electrically coupled between a control or gate terminal XS1 of the first switching off transistor MS1 and the control terminal XG2 of the second clamp transistor MC2.

Furthermore, the first and second driving transistors, M1 and M2, have respective control or gate terminals, X1 and X2, connected to the clamp central node XC.

The first and second driving transistors, M1 and M2, may be high voltage MOS transistors of the type similar to the switching off transistors MS1 and MS2. In the example of the figure, the first driving transistor M1 is a high voltage P-channel MOS transistor (HV Pmos) while the second driving transistor M2 is a high voltage N-channel MOS transistor (HV Nmos). These first and second driving transistors, M1 and M2, have respective first and second equivalent diodes, DM1 and DM2, as indicated in the figure.

In this way, the driving circuit 14 controls the switching off of the switching off transistors MS1 and MS2. The driving circuit 14 drives in high voltage the first and second switching off transistors, MS1 and MS2, forcing their closure during the clamping step, while the first and second clamp transistors, MC1 and MC2, are driven at low voltage (with voltage that varies for example between 0 and 3 V) directly by the input driver block 13.

The output terminal HVout is thus brought to ground and kept to ground thanks to the switching off transistors MS1 and MS2 being driven by the driving circuit 14, at the turning on and switching off of the first and of the second switching off transistors MS1 and MS2 by means of the first and second driving transistors M1 and M2.

It is to be noted that, during the clamping step, also with a load of high value (and under receiving conditions in the case of application to a transmission channel), the current flows through the channel of the transistors of the clamping circuit 11 without charging the intrinsic diodes DMS1 and DMS2 of the switching off transistors MS1 and MS2, overcoming in this way the problems seen in relation to the prior art. The load current does not flow through the junction of the equivalent diodes DMS1 and DMS2 of the switching off transistors MS1 and MS2, but through their channel, avoiding to charge possible junction capacities that would be present with the diodes of the known circuit shown in FIG. 3.

In an embodiment, the clamping circuit facilitates clamping to a voltage reference, in particular to a ground GND, also under clamp conditions of a load of high value and during the receiving in the case of application to a transmission channel, facilitating reducing malfunctions connected to the charge of the junction capacities of the diodes of the circuit being shown in FIG. 3.

For example, each time the clamping circuit is tuned on, the voltage value being on the connection terminal Xdcr reaches a value equal to the ground value GND plus or minus a diode voltage, improving the performances of second harmonic especially at low supply voltages.

Furthermore, a leakage current during a receiving step of the transmission channel which comprises the clamping circuit is conveyed towards the ground reference terminal GND facilitating preventing the output terminal HVout from charging itself and overcoming in this way the drawbacks of the circuits described in relation to the prior art.

Obviously, a technician of the field, with the aim of meeting incidental and specific needs, will be allowed to introduce several modifications and variations to the above described embodiments.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. Concurrently filed U.S. patent application Ser. Nos. 13/538,598, 13/538,802, and 13/538,821 are incorporated herein by reference in their entireties (respectively, each of which claims priority to Italian Application Nos. MI09A002338, MI09A002339, MI09A002340 and MI09A002341, all filed on Dec. 30, 2009, and to International Application Nos. PCT/EP2010/005927, PCT/EP2010/005930, PCT/EP2010/005931 and PCT/EP2010/005932, all filed on Sep. 29, 2010). Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high-voltage clamping device, comprising:
an output;
an input configured to couple to a reference voltage;
a first clamping transistor;
a second clamping transistor;
a first switching transistor coupled between the output and the first clamping transistor; and
a second switching transistor coupled between the output and the second clamping transistor, wherein,
the first and second clamping transistors are high-voltage MOS transistors of complementary types;
the first clamping transistor is coupled between the first switching transistor and the input, the first clamping transistor and the first switching transistor having body diodes coupled together in anti-series; and
the second clamping transistor is coupled between the second switching transistor and the input, the second clamping transistor and the second switching transistor having body diodes coupled together in anti-series.

2. The clamping device of claim 1 wherein said first switching transistor is a high voltage P-channel MOS transistor and said second switching transistor is a high voltage N-channel MOS transistor.

3. The clamping device of claim 1, further comprising a driving circuit coupled to control terminals of said first and second clamp transistors and of said first and second switching transistors and configured to generate driving signals to close said first and second switching transistors when said clamping circuit is active.

4. The clamping device of claim 3 wherein said driving circuit comprises:
a first driving transistor coupled between the control terminal of the first clamping transistor and the control terminal of the second switching transistor; and
a second driving transistor coupled between the control terminal of the second clamping transistor and the control terminal of the first switching transistor.

5. The clamping device of claim 4 wherein said first and second driving transistors have respective control terminals connected to said input.

6. The clamping device of claim 5 wherein the control terminal of the first clamping transistor is configured to couple to an output of a first driver of an input driver block and the control terminal of the second clamping transistor is configured to couple to an output of a second driver of the input driver block.

7. The clamping device of claim 6, further comprising the input driver block wherein the first driver is configured to couple between first and second supply voltage reference terminals and the second driver is configured to couple between the first and second supply voltage reference terminals.

8. The clamping device of claim 1 wherein said first clamping transistor is a high voltage N-channel MOS transistor and said second clamping transistor is a high voltage P-channel MOS transistor.

9. The clamping device of claim 4 wherein said first driving transistor and the first switching transistor are of a first MOS type and the second driving transistor and the second switching transistor are of a second MOS type complementary to the first MOS type.

10. The clamping device of claim 9 wherein said first switching transistor is a high voltage N-channel MOS transistor and said second switching transistor is a high voltage P-channel MOS transistor.

11. A system, comprising:
a voltage clamping core, including:
an input;
an output;
an input configured to couple to a reference voltage;
a first clamping transistor;
a second clamping transistor;

a first switching transistor coupled between the output and the first clamping transistor; and a second switching transistor coupled between the output and the second clamping transistor, wherein, the first and second clamping transistors are high-voltage MOS transistors of complementary types;

the first clamping transistor is coupled between the first switching transistor and the input, the first clamping transistor and the first switching transistor having body diodes coupled together in anti-series; and the second clamping transistor is coupled between the second switching transistor and the input, the second clamping transistor and the second switching transistor having body diodes coupled together in anti-series; and a switching transistor driving block configured to generate driving signals to close said first and second switching transistors when said clamping core is active.

12. The system of claim 11 wherein said switching transistor driving block comprises:

a first driving transistor coupled between the control terminal of the first clamping transistor and the control terminal of the second switching transistor; and a second driving transistor coupled between the control terminal of the second clamping transistor and the control terminal of the first switching transistor.

13. The system of claim 12 wherein said first and second driving transistors have respective control terminals connected to said input.

14. The system of claim 13 wherein the control terminal of the first clamping transistor is configured to couple to an output of a first driver of an input driver block and the control terminal of the second clamping transistor is configured to couple to an output of a second driver of the input driver block.

15. The system of claim 14, further comprising the input driver block wherein the first driver is configured to couple between first and second supply voltage reference terminals and the second driver is configured to couple between the first and second supply voltage reference terminals.

16. The system of claim 11, further comprising:

an anti-noise block coupled between the output of the clamping core and a transmission channel output;

a high-voltage buffer block of the transmission channel; and an input driver block coupled between the high-voltage buffer block and the voltage clamping core.

17. The system of claim 11 wherein the reference voltage is a ground.

18. A transmission channel, comprising:

means for clamping an output of the transmission channel to a reference voltage, the means for clamping including first and second MOS clamping transistors; and anti-charging means including a first MOS switching transistor coupled to the first MOS clamping transistor with body diodes coupled together in anti-series and a second MOS switching transistor coupled to the second MOS clamping transistor with body diodes coupled together in anti-series.

19. The transmission channel of claim 18 wherein the anti-charging means comprises means for closing said first and second switching transistors when said means for clamping is activated.

20. The transmission channel of claim 19, further comprising means for driving the means for clamping.

21. The transmission channel of claim 20, further comprising means for buffering coupled to the means for driving.

22. The transmission channel of claim 21, further comprising means for reducing noise coupled to the means for clamping.

23. A method, comprising:

transmitting a series of high-voltage pulses through a transmission channel; and clamping an output of the transmission channel to a reference voltage between pulses, the clamping including, closing a first switching MOS transistor coupled between a first clamping transistor and the output, wherein the first clamping transistor is coupled between the reference voltage and the first switching transistor; and closing a second switching MOS transistor coupled between a second clamping transistor and the output, wherein the second clamping transistor is coupled between the reference voltage and the second switching MOS transistor.

24. The method of claim 23, comprising opening the first and second switching transistors during transmission of the pulses.

25. The method of claim 23, further comprising listening for echos of the pulses.

\* \* \* \* \*